US008082525B2

(12) United States Patent
Liu et al.

(10) Patent No.: US 8,082,525 B2
(45) Date of Patent: Dec. 20, 2011

(54) TECHNIQUE FOR CORRECTING HOTSPOTS IN MASK PATTERNS AND WRITE PATTERNS

(75) Inventors: Yong Liu, Fremont, CA (US); John F. McCarty, Redwood City, CA (US); Kelly Gordon Russell, Santa Clara, CA (US); Linyong Pang, Palo Alto, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 317 days.

(21) Appl. No.: 12/423,693

(22) Filed: Apr. 14, 2009

(65) Prior Publication Data

US 2009/0293037 A1 Nov. 26, 2009

Related U.S. Application Data

(60) Provisional application No. 61/045,205, filed on Apr. 15, 2008.

(51) Int. Cl.
*G06F 17/50* (2006.01)
*G06F 19/00* (2011.01)
*G03F 1/00* (2006.01)
*G21K 5/00* (2006.01)
(52) U.S. Cl. ............... 716/52; 716/53; 716/54; 716/55; 716/111; 700/120; 700/121; 430/5; 378/35
(58) Field of Classification Search ............... 716/52, 716/53, 54, 55, 111; 700/120, 121; 430/5; 378/35
See application file for complete search history.

(56) References Cited

U.S. PATENT DOCUMENTS

| 7,062,748 | B2 * | 6/2006 | Mellmann | 716/52 |
| 7,784,015 | B2 * | 8/2010 | Pitts | 716/52 |
| 7,865,864 | B2 * | 1/2011 | Banerjee et al. | 716/53 |
| 2004/0268282 | A1 * | 12/2004 | Rittman et al. | 716/10 |
| 2005/0014074 | A1 * | 1/2005 | Liebmann et al. | 430/5 |
| 2005/0022151 | A1 * | 1/2005 | Rittman et al. | 716/19 |
| 2005/0050511 | A1 * | 3/2005 | Mellmann | 716/19 |
| 2006/0024590 | A1 * | 2/2006 | Sandhu | 430/5 |
| 2006/0107248 | A1 * | 5/2006 | Liebmann et al. | 716/19 |
| 2006/0122724 | A1 * | 6/2006 | Croke et al. | 700/121 |
| 2006/0150131 | A1 * | 7/2006 | Lai et al. | 716/5 |
| 2007/0198963 | A1 * | 8/2007 | Granik et al. | 716/19 |
| 2008/0005718 | A1 * | 1/2008 | Green | 716/21 |
| 2008/0063948 | A1 * | 3/2008 | O'Brien | 430/5 |
| 2009/0199151 | A1 * | 8/2009 | Banerjee et al. | 716/20 |

FOREIGN PATENT DOCUMENTS

WO  WO 2008097219 A2 *  8/2008

* cited by examiner

*Primary Examiner* — Phallaka Kik
(74) *Attorney, Agent, or Firm* — Wilson Sonsini Goodrich & Rosati

(57) ABSTRACT

Embodiments of a method for determining a mask pattern to be used on a photo-mask in a lithography process are described. This method may be performed by a computer system. During operation, this computer system receives at least a portion of a first mask pattern including first regions that violate pre-determined rules associated with the photo-mask. Next, the computer system determines a second mask pattern based on at least the portion of the first mask pattern, where the second mask pattern includes second regions that are estimated to comply with the pre-determined rules. Note that the second regions correspond to the first regions, and the second mask pattern is determined using a different technique than that used to determine the first mask pattern.

24 Claims, 8 Drawing Sheets

```
                  ┌──────────┬─────────────┐
PATTERN 610-1 ──  │ PIXEL    │ VALUE       │
                  │ 612-1    │ 614-1       │
                  ├──────────┼─────────────┤   ...   ┌──────────┬─────────────┐
PATTERN 610-2 ──  │ PIXEL    │ VALUE       │         │ PIXEL    │ VALUE       │
                  │ 612-3    │ 614-3       │         │ 612-2    │ 614-2       │
                  └──────────┴─────────────┘         └──────────┴─────────────┘
                                                                          ⟵ 600
```

FIG. 6

```
                  ┌──────────┬─────────────┐
PATTERN 710-1 ──  │ PIXEL    │ VALUE       │
                  │ 712-1    │ 714-1       │
                  ├──────────┼─────────────┤
PATTERN 710-2 ──  │ ADDITIONAL│ ADDITIONAL │   ...   ┌──────────┬─────────────┐
                  │ INFORMATION│ INFORMATION│        │ PIXEL    │ VALUE       │
                  │ 716-1    │ 716-2       │         │ 712-2    │ 714-2       │
                  └──────────┴─────────────┘         └──────────┴─────────────┘
                                                                          ⟵ 700
```

FIG. 7

TECHNIQUE FOR CORRECTING HOTSPOTS IN MASK PATTERNS AND WRITE PATTERNS

CROSS REFERENCE

This application claims the benefit of U.S. Provisional Application No. 61/045,205, filed Apr. 15, 2008, which application is incorporated herein by reference.

BACKGROUND OF THE INVENTION

1. Field of the Invention

The present invention relates to systems and techniques for determining write patterns for maskless-lithography processes that use write devices and mask patterns for lithography processes that use photo-masks.

2. Related Art

Lithography processing represents an essential technology for manufacturing Integrated Circuits (IC) and Micro Electro-Mechanical Systems (MEMS). Lithographic techniques are used to define patterns, geometries, features, shapes, etc. onto an integrated-circuit die, semiconductor wafer, or chips, where the patterns are typically defined by a set of contours, lines, boundaries, edges, curves, etc., which generally surround, enclose, and/or define the boundary of the various regions which constitute the patterns.

One existing lithographic technique is photolithography, in which images defined by photo-masks are printed onto the integrated-circuit die or the semiconductor wafers. Furthermore, another existing lithographic technique is maskless lithography, in which a write device directly prints a write pattern onto the integrated-circuit die or the semiconductor wafers, thereby eliminating the need for photo-masks. Unfortunately, it is increasingly difficult to determine the write patterns, or to design and manufacture photo-masks.

In particular, demand for increased density of features on the integrated-circuit die and semiconductor wafers has resulted in the design of circuits with decreasing minimum dimensions. These trends have significantly increased the complexity of the computations necessary to determine the write patterns and/or the mask patterns (to which the photo-masks correspond), with a commensurate impact on computation time, processing requirements, and expense.

Furthermore, due to the wave nature of light, as dimensions approach sizes comparable to the wavelength of the light used in the photolithography processes, the resulting wafer patterns deviate from the corresponding photo-mask patterns and are accompanied by unwanted distortions and artifacts. Existing techniques (such as optical proximity correction or OPC, and resolution enhancement technologies or RET) are used to pre-distort the mask patterns to improve resolution and/or to improve a process window (i.e., a range of process conditions that result in acceptable yield) in a photolithography process.

While these techniques may ensure that the wafer pattern is printed more accurately, determining the pre-distorted mask patterns is increasingly difficult, thereby exacerbating the computational complexity and the associated problems. For example, computing the pre-distorted mask patterns may be complicated by the presence of multiple potential solutions (such as local minima) in a higher-dimensional solution space. Moreover, while many of these solutions may produce similar wafer patterns, it may be easier to manufacture photo-masks corresponding to some of the solutions than others. Consequently, identifying a suitable pre-distorted mask pattern may be time-consuming and expensive.

Moreover, many of the mask patterns and/or write patterns determined using existing techniques include one or more regions (which are sometimes referred to as hotspots) that violate pre-determined rules associated with the lithographic and/or photolithographic processes. As the density of features increases, it is increasingly difficult to correct the hotspots (so that these regions comply with the pre-determined rules) using existing techniques.

Hence, what is needed is a method and an apparatus that facilitates determination of write patterns and mask patterns without the above-described problems.

SUMMARY OF THE INVENTION

One embodiment of the present invention provides a method for determining a mask pattern to be used on a photo-mask in a lithography process, which may be performed by a computer system. During operation, this computer system receives at least a portion of a first mask pattern including first regions that violate pre-determined rules associated with the photo-mask. Next, the computer system determines a second mask pattern based on at least the portion of the first mask pattern, where the second mask pattern includes second regions that are estimated to comply with the pre-determined rules. Note that the second regions correspond to the first regions, and the second mask pattern is determined using a different technique than that used to determine the first mask pattern.

In some embodiments, the computer system further receives the first mask pattern.

In some embodiments, the computer system further analyzes the first mask pattern using the predetermined rules to identify the first regions and extracts at least the portion of the first mask pattern. Note that the analysis of the first mask pattern may involve verification. Moreover, the verification may be image-based.

In some embodiments, the identification of the first regions involves identifying locations associated with violations of the pre-determined rules, and the extraction of at least the portion of the first mask pattern involves calculating the first regions based on one or more geometric relationships for shapes surrounding the locations. For example, the one or more geometric relationships may include overlapping shapes or adjacent shapes, such as polygons, that contact each other along an edge. Moreover, in some embodiments the extraction of at least the portion of the first mask pattern involves aggregating the calculated first regions.

In some embodiments, the receiving involves accessing at least the portion of the first mask pattern in a computer-readable memory.

In some embodiments, the computer system further applies an Optical Proximity Correction (OPC) to at least the portion of the first mask pattern prior to the determination of the second mask pattern.

In some embodiments, the computer system further merges the second mask pattern with a remainder of the first mask pattern, where the remainder of the first mask pattern excludes the first regions.

In some embodiments, the first regions include hotspots.

In some embodiments, the pre-determined rules include manufacturing rules associated with the photo-mask.

In some embodiments, at least the portion of the first mask pattern further includes third regions, where a given third region surrounds a given first region. Note that the third regions may be unchanged during the determination of the second mask pattern. Moreover, in some embodiments a second portion of the third regions are changed during the determination of the second mask pattern, and this second portion of the third regions is a transition region between the second regions and the first portion of the second regions.

In some embodiments, an optical characteristic of the second portion of the third regions is approximately unchanged or is improved relative to the optical characteristic of the second portion of the third regions in at least the portion of the first mask pattern. For example, the optical characteristic may include intensity, contrast, depth of focus, and/or a mask error enhancement factor.

In some embodiments, the first mask pattern includes multiple subsets that are to be processed by a group of processors, where the portion of the first mask pattern includes those multiple subsets that are proximate to the first regions. Note that in some embodiments at least some of the subsets are processed in parallel.

In some embodiments, the computer system further analyzes the second mask pattern using the predetermined rules to confirm that the second regions comply with the pre-determined rules. Note that the analysis of the second mask pattern may involve verification.

In some embodiments, the determination of the second mask pattern involves an inverse lithographic calculation that includes a projection of a target pattern at an image plane in the photolithographic process to an object plane in the photolithographic process.

In some embodiments, the determination of the second mask pattern involves image-based or pixel-based correction.

In some embodiments, at least the portion of the first mask pattern is included in a file that is compatible with a GDSII format.

Another embodiment provides the computer system configured to execute instructions corresponding to at least some of the above-described operations.

Another embodiment provides a computer-program product for use in conjunction with the computer system, which includes instructions corresponding to at least some of the above-described operations.

Another embodiment provides a semiconductor wafer. This semiconductor wafer is produced in the photolithography process that uses the photo-mask.

Another embodiment provides the photo-mask.

Another embodiment provides a data file stored in a computer-readable memory that includes information corresponding to the mask pattern.

Another embodiment provides another method in which at least some of the above-described operations are used for generating a write pattern (instead of a mask pattern) to be used in a maskless-lithographic process.

Another embodiment provides another computer-program product for use in conjunction with the computer system, which includes instructions corresponding to at least some of the above-described operations for generating the write pattern.

Another embodiment provides another semiconductor wafer. This semiconductor wafer is produced in the maskless-lithography process.

Another embodiment provides another data file stored in a computer-readable memory that includes information corresponding to the write pattern.

One embodiment of the present invention provides a third method for determining a mask pattern to be used on a photo-mask in a lithography process, which may be performed by another computer system. During operation, this other computer system receives a file including a first mask pattern and additional information associated with regions in the first mask pattern that violate pre-determined rules associated with the photo-mask. Next, the other computer system determines a second mask pattern based on the first mask pattern, wherein the second mask pattern is estimated to comply with the predetermined rules.

In some embodiments, the regions include hotspots.

In some embodiments, the information is included in a single-layer in the file. Moreover, the file may be compatible with a GDSII format.

In some embodiments, the regions include polygons, where a given polygon surrounds a portion of the first mask pattern that violates the pre-determined rules.

In some embodiments, the pre-determined rules include manufacturing rules associated with the photo-mask.

In some embodiments, the regions are determined during verification.

In some embodiments, the other computer system further performs verification on the second mask pattern to confirm that the second mask pattern complies with the pre-determined rules. Note that the verification may be image-based.

In some embodiments, the determination of the second mask pattern involves image-based and/or pixel-based correction.

In some embodiments, the determination of the second mask pattern involves an inverse lithographic calculation that includes a projection of a target pattern at an image plane in the photolithographic process to an object plane in the photolithographic process.

In some embodiments, the second mask pattern is determined using a different technique than that used to determine the first mask pattern.

Another embodiment provides the other computer system configured to execute instructions corresponding to at least some of the above-described operations.

Another embodiment provides a third computer-program product for use in conjunction with the other computer system, which includes instructions corresponding to at least some of the above-described operations.

Another embodiment provides a third semiconductor wafer. This third semiconductor wafer is produced in the photolithography process that uses the photo-mask.

Another embodiment provides the photo-mask.

Another embodiment provides a third data file stored in a computer-readable memory that includes information corresponding to the mask pattern.

Another embodiment provides a fourth method in which at least some of the above-described operations are used for generating a write pattern (instead of a mask pattern) to be used in a maskless-lithographic process.

Another embodiment provides a fourth computer-program product for use in conjunction with the other computer system, which includes instructions corresponding to at least some of the above-described operations for generating the write pattern.

Another embodiment provides a fourth semiconductor wafer. This semiconductor wafer is produced in the maskless-lithography process.

Another embodiment provides a fourth data file stored in a computer-readable memory that includes information corresponding to the write pattern.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 6 is a block diagram illustrating a data structure in accordance with an embodiment of the present invention.

FIG. 7 is a block diagram illustrating a data structure in accordance with an embodiment of the present invention.

Note that like reference numerals refer to corresponding parts throughout the drawings.

DETAILED DESCRIPTION OF THE INVENTION

Figure 1A:
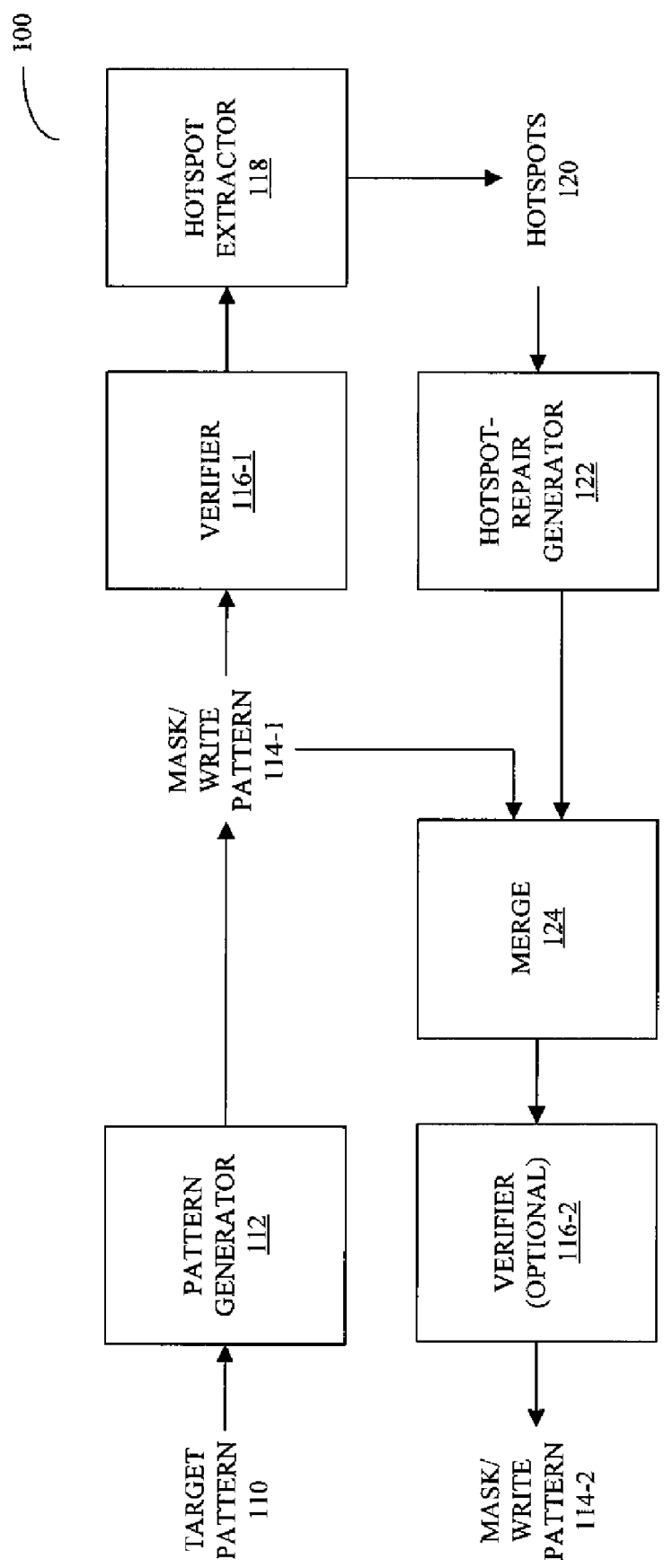
FIG. 1A is a block diagram illustrating determination of a mask pattern and/or a write pattern in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, a computer program product (i.e., software), and a data structure or a file for use with the computer system are described. These systems, processes, and/or data structures may be used to determine or generate mask patterns that are used to produce photo-masks, which in turn are used to produce integrated-circuit die and/or semiconductor wafers (henceforth referred to as semiconductor wafers) during a photolithographic process. Furthermore, in some embodiments the systems, processes, and/or data structures are used to determine or generate write patterns that are used to produce the semiconductor wafers during a maskless-lithographic process (such as a process that uses a direct write device). In particular, the photo-mask may be used to project an aerial image or print a pattern (henceforth referred to as the printed pattern) corresponding to a target pattern in a design (such as a design layer in an integrated circuit) on to a semiconductor wafer. Alternatively, a write device (such as a laser writer or an e-beam writer) may use the write pattern to write a pattern on to the semiconductor wafer. In the discussion that follows, determination or generating of a mask pattern is used as an illustrative example.

In some embodiments, a file containing at least the regions in a mask pattern that violate pre-determined rules (such as design and/or manufacturing rules) associated with the photo-mask is received. These regions may include so-called hotspots in the mask pattern. Next, another mask pattern may be determined based on at least the regions using a different technique than that used to determine the mask pattern. This other mask pattern may include additional regions, which correspond to the regions, and which comply with the pre-determined rules.

In some embodiments, a remainder of the mask pattern, which excludes the regions, is merged with the other mask pattern. Moreover, in some embodiments, the other mask pattern is analyzed (for example, during verification) to confirm that the additional regions comply with the predetermined rules.

In some embodiments, at least the regions are identified in the mask pattern (for example, during verification) and are extracted to produce the file. However, in some embodiments the file includes the mask pattern as well as information associated with the regions. This information may be included in a single layer in the file. Note that the file may be compatible with a GDSII format.

In an example embodiment, the mask pattern is at least in part determined using a technique that includes Optical Proximity Correction or OPC. Moreover, the determination of the other mask pattern may involves an inverse lithographic calculation that includes a projection of a target pattern at an image plane in the photolithographic process to an object plane in the photolithographic process.

We now describe embodiments of a system or technique for determining or generating mask patterns and/or write patterns. FIG. 1A presents a block diagram 100 illustrating an embodiment of determining a mask pattern and/or a write pattern. During the determining, a pattern generator 112 determines mask or write pattern 114-1 based on a target pattern 110, such as the target pattern to be produced on a semiconductor die during a photolithographic or lithographic process. Next verifier 116-1 may analyze mask or write pattern 114-1 to determine if it complies with pre-determined rules, such as those associated with manufacturing of a photo-mask to be used in the photo-lithographic process.

If one or more regions in the mask or write pattern 114-1 violate one or more of the pre-determined rules, hot-spot extractor 118 may extract these regions and output hotspots 120. Then, hotspot-repair generator 122 may modify the regions such that they are estimated to comply with the pre-determined rules.

In some embodiments, a merge 124 component combines the modified regions with the mask or write pattern 114-1 (or a remainder of the mask or write pattern 114-1 that excludes the regions) and outputs a new mask or write pattern 114-2. Moreover, in some embodiments an optional verifier 116-2 confirms that the modified regions comply with the pre-determined rules.

In some embodiments, at least some of the functions illustrated in block diagram 100 are performed by different parties. For example, a first party may generate the mask or write pattern 114-1. Then, a second party may perform verification and/or extraction of hotspots 120. These hotspots and the mask or write pattern 114-1 (or the remainder of the mask or write pattern 114-1 that excludes the regions) may be provided to a third party that generates the mask or write pattern 114-2. Note that the hotspots 120 may be provided to the third party in a file that is compatible with a GDS format, such as GDSII.

In some embodiments, different techniques are used to determine the mask or write pattern 114-1 and to determine the modified regions. For example, during or after the determining of the mask or write pattern 114-1 using pattern generator 112, OPC may be applied to the mask or write pattern 114-1. Note that OPC may be applied to the regions corresponding to the hotspots 120. Moreover, in some embodiments the determination of the mask or write pattern 114-2 involves an inverse lithographic calculation that includes a projection of the target pattern 110 at an image plane in the lithographic or photolithographic process to an object plane in the lithographic or photolithographic process.

Note that in some embodiments verification performed by either or both of the verifiers 116 is image-based. Moreover, in some embodiments the determination of the mask or write pattern 114-2 using the hotspot-repair generator 122 involves image-based and/or pixel-based correction.

While block diagram 100 describes an embodiment in which hotspots 120 are extracted prior to being repaired, in other embodiments these regions are identified and a single file that includes the hotspots 120 as well as the remainder of the mask or write pattern 114-1 is transmitted (for example, to the third party) for repair. Processing a single file may eliminate or reduce the challenges associated with dealing with multiple files for different hotspots 120 and the large number of variations in how the hotspots 120 or regions in these files may overlap. For example, it may be difficult to break a given hotspot into pieces because of error propagation (which may not be repairable).

Figure 1B:
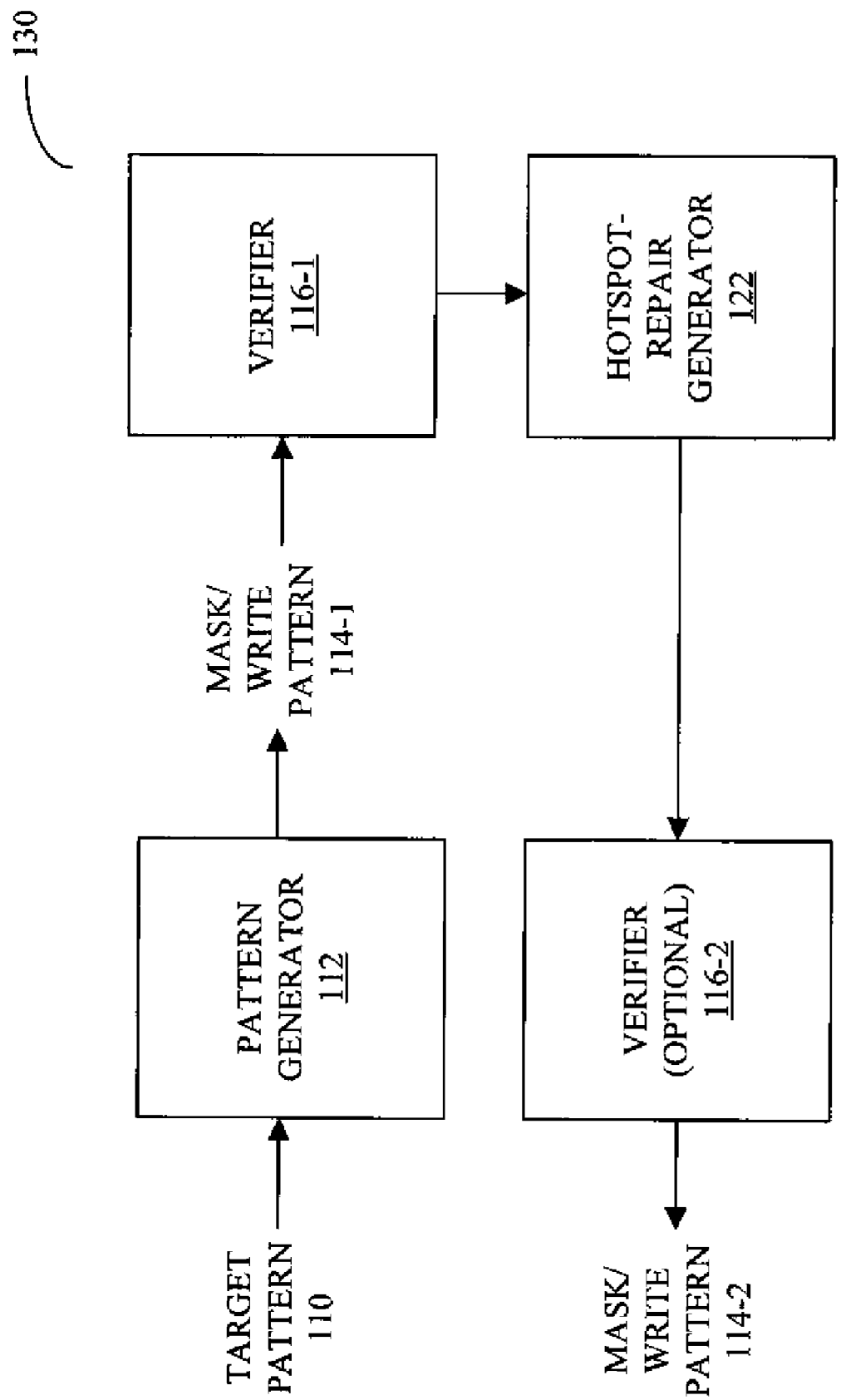
FIG. 1B is a block diagram illustrating determination of a mask pattern and/or a write pattern in accordance with an embodiment of the present invention.

This technique is shown in FIG. 1B, which presents a block diagram 130 illustrating an embodiment of determining a mask pattern and/or a write pattern. In particular, hotspot-repair generator 122 may receive the single file and may modify the regions or hotspots 120 (FIG. 1A) to produce the mask or write pattern 114-2. Note that this single file may include the mask or write pattern 114-1 as well as additional information associated with regions or hotspots 120 (FIG. 1A). Moreover, in some embodiments this information is included in single-layer in the file and/or the file may be compatible with a GDS format, such as a GDSII format.

Note that in some embodiments, block diagram 100 (FIG. 1A) and/or block diagram 130 there may be fewer or additional components. For example, at least a subset of the mask or write pattern 114-1 and/or the hotspots 120 (FIG. 1A) may be processed by a group of processors in parallel. A given subset or work unit may include or may be within optical proximity of one of the hotspots 120 (FIG. 1A). Moreover, two or more components may be combined into a single component, and/or a position of one or more components may be changed.

Figure 2A:
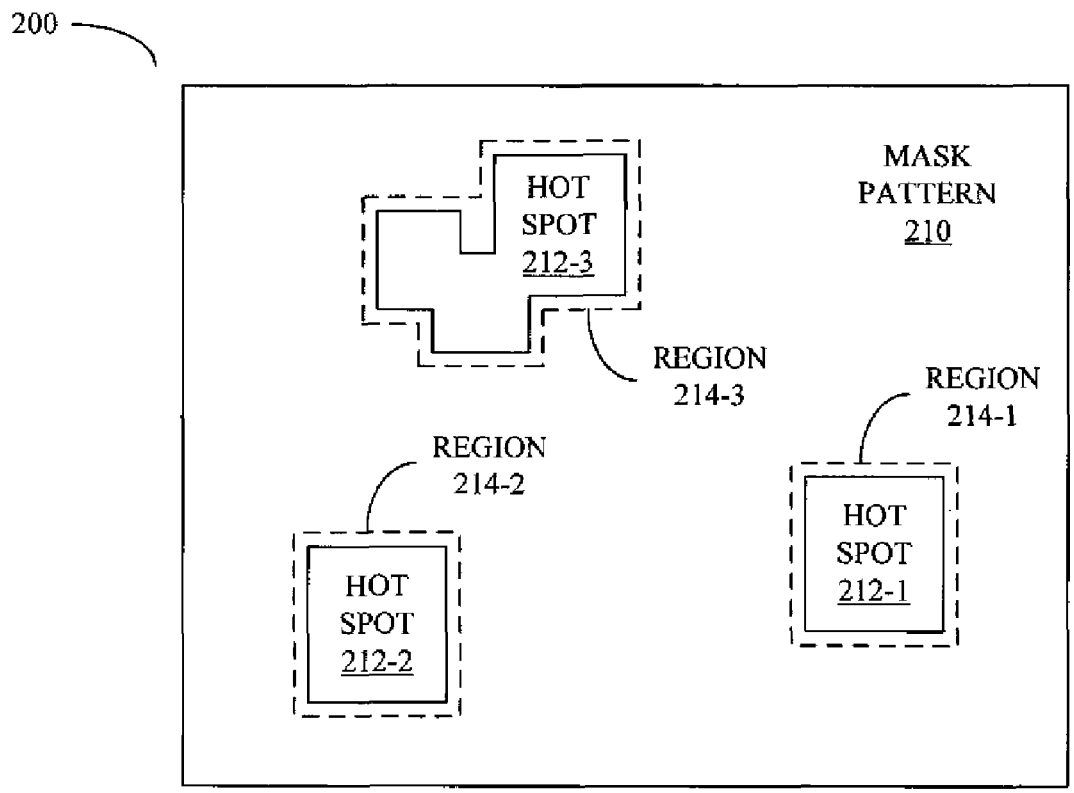
FIG. 2A is a block diagram illustrating a mask pattern in accordance with an embodiment of the present invention.

We now describe embodiments of identifying and/or extracting regions or hotspots in a mask pattern and/or a write pattern. In the discussion that follows, a mask pattern is used as an illustrative example. FIG. 2A presents a block diagram illustrating an embodiment 200 of a mask pattern 210. In this mask pattern, several hotspots 212 have been identified. In an example embodiment, the hotspots 212 include less than 5% of a 4 cm$^2$ mask or write pattern.

Note that these hotspots correspond to locations (such as seed locations) associated with violations of the pre-determined rules. Moreover, halos or regions 214 are determined or defined, each of which surrounds one of the hotspots 212. As discussed below, the hotspots 212 and regions 214 may be used to extract at least a portion of the mask pattern 210 for processing using the hotspot-repair generator 122 (FIGS. 1A and 1B).

In some embodiments, the hotspots 212 and/or the regions 214 are determined or defined based on one or more geometric relationships for shapes surrounding the locations. For example, the one or more geometric relationships may include overlapping shapes or adjacent shapes, such as polygons, that contact each other along an edge. Moreover, in some embodiments the hotspots 212 and/or the regions 214 are determined or defined by aggregating the shapes.

In an example embodiment, areas associated with the hotspots 212 and the regions 214 are extracted from the mask pattern 210 to produce a sparse file, which may be compatible with a GDS format. This sparse file may be processed as described previously with reference to FIG. 1A.

In some embodiments, the sparse file includes portions (such as hotspots 212 and regions 214) of the target layer and/or portions of reference layers (which include aspects of the design other than the target pattern) in the mask pattern 210. Note that there may be portions of between 6-32 reference layers in the sparse file. In some embodiments, the sparse file also includes portions of an OPC layer which includes information associated with OPC correction.

Figure 2B:
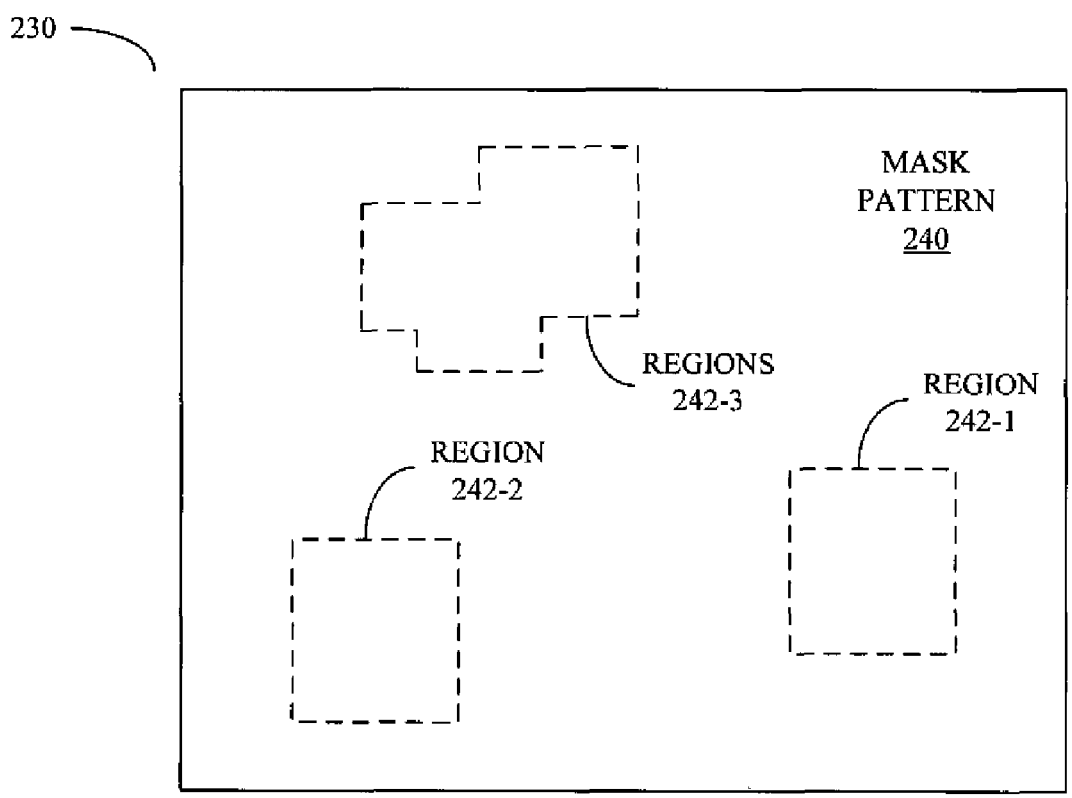
FIG. 2B is a block diagram illustrating a mask pattern in accordance with an embodiment of the present invention.

After processing by the hotspot-repair generator 122 (FIGS. 1A and 1B), an output file may be produced that includes modified areas or regions corresponding to the hotspots 212 and/or the regions 214. These regions 242 are shown in FIG. 2B, which presents a block diagram illustrating an embodiment 230 of a mask pattern 240. As noted previously, the regions 240 are expected to comply with the pre-determined rules.

Figure 2C:
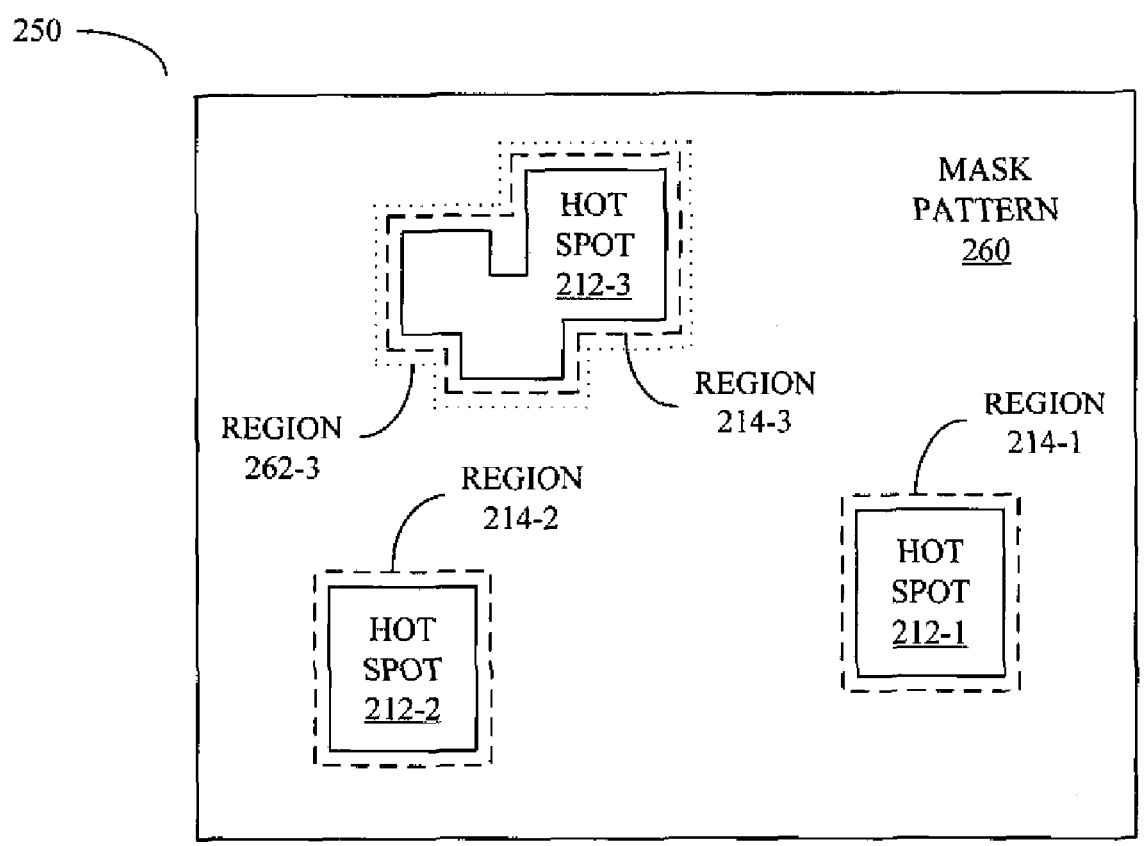
FIG. 2C is a block diagram illustrating a mask pattern in accordance with an embodiment of the present invention.

In other embodiments, additional regions each of which surrounds one of the hotspots 212 (FIG. 2A) are defined for use during hotspot processing. These regions 262 are shown in FIG. 2C, which presents a block diagram illustrating an embodiment 250 of a mask pattern 260. In particular, in some embodiments, during the determination of the modified regions, the hotspots 212 may be modified, and the regions 214 and 262 are unmodified. However, in some embodiments at least some regions, such as region 214-3 which is sandwiched between hotspot 212-3 and region 262-3, is modified.

In some embodiments, during the determining of the modified regions, a merit or cost function (which is described below in the discussion of an inverse calculation) is determined using hotspots 212 and/or the regions 214.

In some embodiments, a size of the regions 214 is 2 times an interaction range associated with a lithographic or a photolithographic process. Note that the interaction range is a function of a wavelength in this process divided by a numerical aperture associated with an optical path. Moreover, a size of the regions 262 may be 0.2 times the interaction range.

Note that in some embodiments, an optical characteristic of the regions 214 is approximately unchanged or is improved during the determining of the modified regions. For example, the optical characteristic may include: the intensity, the contrast, the depth of focus, and/or a mask error enhancement factor.

In an example embodiment, the single file includes first markers corresponding to the hotspots 212, the regions 214, and the logical AND of the hotspots 212 and the regions 214. These markers may be included in a single layer in the file. Moreover, the first markers may be used to extract the portion of the target layer, the reference layer(s), and/or the OPC layer associated with the mask or write pattern 114-1 (FIGS. 1A and 1B).

In addition, the merge 124 component (FIG. 1A) may use additional markers M1 and M2, where M1 includes the OPC layer minus the first markers and M2 includes the logical AND of the regions 240 (FIG. 213) and the first markers. In particular, the merge 124 component (FIG. 1A) may use the logical OR of M1 and M2.

While files that are compatible with a GDS format, such as a GDSII or OASIS format, have been described previously, in some embodiments one or more files used during the determination of the mask or write patterns 114 (FIGS. 1A and 1B) and/or the hotspots 120 (FIG. 1A) may be flat or hierarchical. Consequently, conversions from one file format to another (and back again) may be performed. For example, a file compatible with a GDSII format may be converted to a pixel-based representation or a format having fewer levels than the original format. Acceptable file formats may include those with a pixel-based format (i.e., spatially discrete) data patterns (such as bitmap and/or grayscale images), binary patterns, and/or continuous-tone patterns.

Note that in some embodiments, mask pattern 210 (FIG. 2A), mask pattern 240 (FIG. 2B), and/or mask pattern 250 there may be fewer or additional components. Moreover, two or more components may be combined into a single component, and/or a position of one or more components may be changed.

Figure 3:
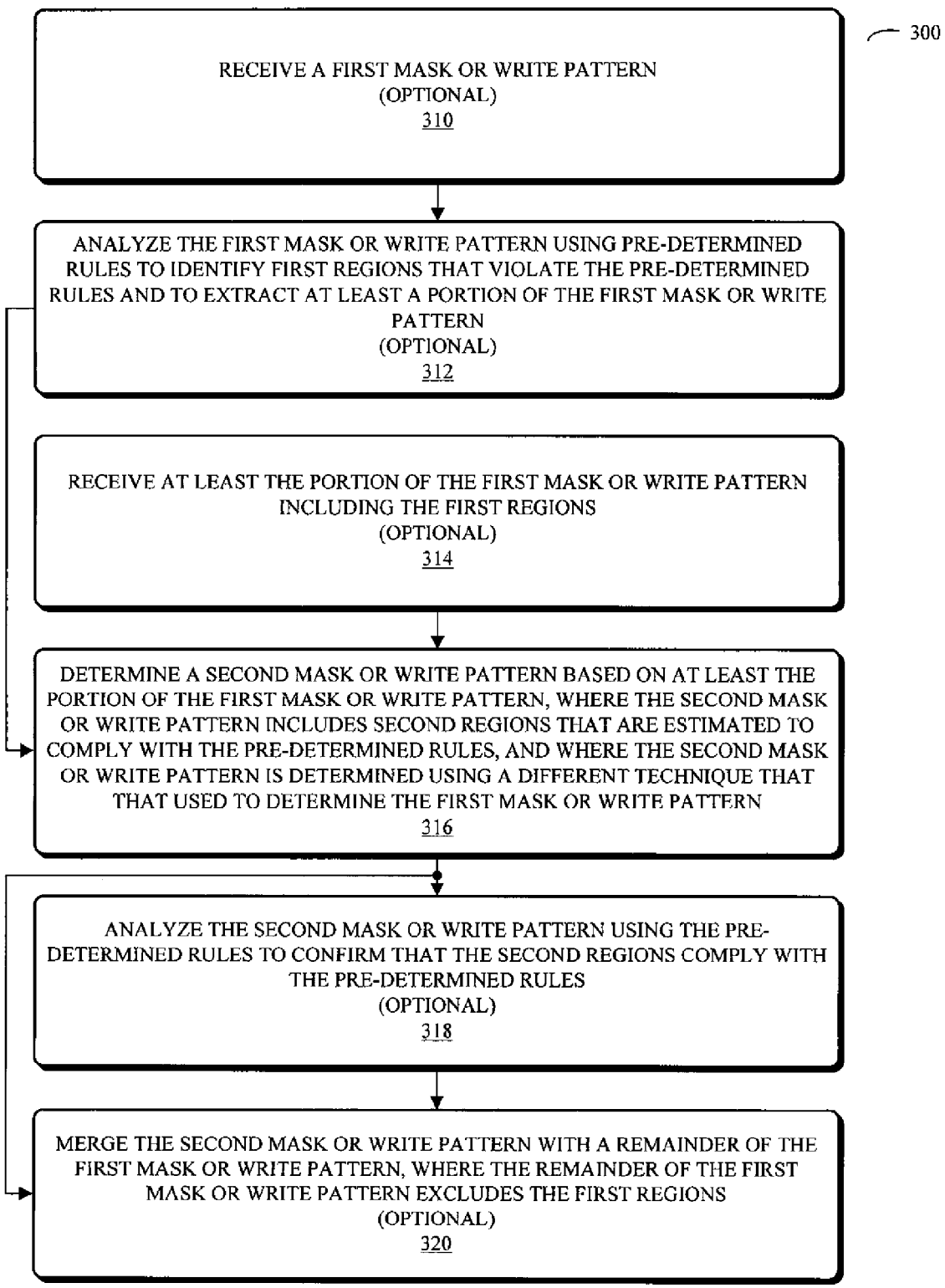
FIG. 3 is a flowchart illustrating a process for generating the mask pattern and/or the write pattern in accordance with an embodiment of the present invention.

We now describe embodiments of processes for generating write patterns and/or mask patterns. FIG. 3 presents a flowchart illustrating an embodiment of a process 300 for generating the mask pattern and/or the write pattern, which may be performed by a computer system. During operation, this computer system optionally receives a first mask or write pattern (310). Next, the computer system optionally analyzes the first mask or write pattern using pre-determined rules to identify first regions that violate the pre-determined rules and to extract at least a portion of the first mask or write pattern (312). Note that the pre-determined rules may be associated with a photo-mask or a lithographic process, such as a photolithographic process or a maskless-lithography process. Alternatively, the computer system optionally receives at least a portion of the first mask or write pattern including the first regions (314).

Then, the computer system determines a second mask or write pattern based on at least the portion of the first mask or write pattern, where the second mask or write pattern includes second regions that are estimated to comply with the pre-determined rules (316). Note that the second regions correspond to the first regions, and the second mask or write pattern is determined using a different technique than that used to determine the first mask or write pattern.

In some embodiments, the computer system optionally analyzes the second mask or write pattern using the pre-determined rules to confirm that the second regions comply with the pre-determined rules (318). Moreover, in some embodiments, the computer system optionally merges the second mask or write pattern with a remainder of the first mask or write pattern, where the remainder of the first mask or write pattern excludes the first regions (320).

Figure 4:
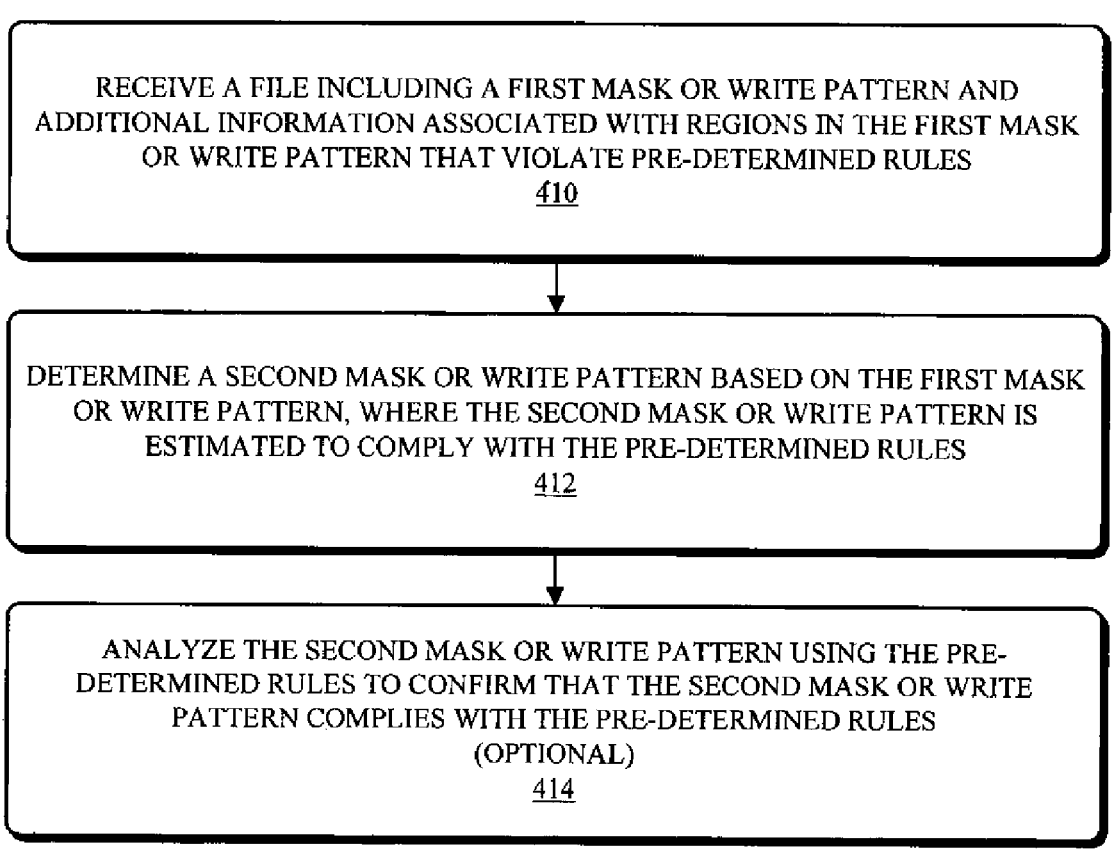
FIG. 4 is a flowchart illustrating a process for generating the mask pattern and/or the write pattern in accordance with an embodiment of the present invention.

FIG. 4 presents a flowchart illustrating an embodiment of a process 400 for generating the mask pattern and/or the write pattern, which may be performed by a computer system. During operation, this computer system receives a file including a first mask or write pattern and additional information associated with regions in the first mask or write pattern that violate pre-determined rules (410). Next, the computer system determines a second mask or write pattern based on the first mask or write pattern, where the second mask or write pattern is estimated to comply with the pre-determined rules (412). Moreover, in some embodiments, the computer system optionally analyzes the second mask or write pattern using the predetermined rules to confirm that the second mask or write pattern complies with the pre-determined rules (414).

Note that in some embodiments of the process 300 (FIG. 3) and/or 400 there may be additional or fewer operations. Moreover, the order of the operations may be changed and/or two or more operations may be combined into a single operation.

We now describe embodiments of an inverse calculation (such as an inverse lithography calculation) that may be used to determine or generate one or more write patterns and/or mask patterns. This inverse calculation may be based on minimization of an error function (which is also sometimes referred to as a cost function or a Hamiltonian function). During each iteration of the calculation, an error function may be a function of the difference between the estimated wafer pattern that results when the aerial image or printed pattern associated with the write pattern or the mask pattern is projected through an optical path in an optical system during a lithographic process. In some embodiments, multiple images may be used, such as those corresponding to a range of process conditions or multiple exposures.

A forward calculation may also be used when determining the cost function. In the discussion that follows, coherent illumination by an illumination pattern associated with the source in the lithographic process is assumed. Furthermore, the electric field falling on the photo-mask (which is associated with the mask pattern) or provided by a write device (based on the write pattern) is approximately constant. Using photo-lithography as an example, note that some regions of the photo-mask (such as those corresponding to '0s' in a binary mask pattern) reflect the light to the semiconductor wafer at the image plane of the optical system, while other regions (such as those corresponding to '1s' in the binary mask pattern) do not reflect the light to the semiconductor wafer. It follows that a scalar electric field E after reflection off of the photo-mask (which is henceforth referred to as an image pattern), may be expressed as $$E(\vec{r}) = \left\{ \begin{array}{c} 0 \\ 1 \end{array} \right\},$$

where $\vec{r}=(x,y)$ is a point on the (x,y) plane. More generally, the electric field may include grayscale values in the range $\{-1, 1\}$ or arbitrary complex numbers that correspond to the features of the photo-mask. Thus, chrome-on-glass photo-masks and various types of photo-masks other than chrome on glass, such as attenuated phase shifting, strong phase shifting, other materials, etc., are within the scope of the present invention.) Note that this representation of the image pattern may be re-expressed using a function φ (referred to as a level-set function) having positive regions that indicate light reflected to the semiconductor wafer and negative regions that indicate an absence of light reflected to the semiconductor wafer. (More generally, the level-set function may have two or more levels and a given mask pattern or write pattern may be represented by one or more level-set functions.) Furthermore, the level-set function may equal zero at the boundaries or contours of features of the photo-mask. Therefore, the electric field E associated with the photo-mask (and thus, the mask pattern) may be re-expressed as a function of this level-set function, i.e., $$E(\vec{r}) = \hat{h}(\Phi(x,y)),$$

where $\hat{h}$ is a transmission or reflection function $$\hat{h}(x) = \begin{cases} 1 & x \geq 0 \\ 0 & x < 0 \end{cases}.$$

Since an ideal diffraction limited lens acts as a low-pass filter, this may be used as an approximation to the actual (almost but not quite perfect) optics in the optical path in the optical system. Mathematically, the action of a lens may be expressed as $$A(\vec{r}) = f^{-1}(\hat{C}(f(E(\vec{r}))))$$

where $A(\vec{r})$ indicates the electric field distribution on the wafer, f indicates the Fourier transform, $f^{-1}$ indicates the inverse Fourier transform, and $\hat{C}$ indicates the pupil cutoff function, which is zero for frequencies larger than a threshold determined by the numerical aperture of the lens, and one otherwise. Thus, the pupil function is $$\hat{C}(k_x, k_y) = \hat{h}(k_{max}^2 - [k_x^2 + k_y^2]) = \begin{cases} 0 & k_x^2 + k_y^2 \geq k_{max}^2 \\ 1 & k_x^2 + k_y^2 < k_{max}^2 \end{cases},$$

wherein $k_x$, $k_y$ and $k_{max}$ represent frequency coordinates in Fourier space. Therefore, the intensity pattern on the semiconductor wafer is simply the square of the electric field $$I(\vec{r}) = |A(\vec{r})|^2.$$

Combining these two equations, we find $$F(\phi(x,y)) = (|f^{-1}(\hat{C}(f(\hat{h}(\Phi(x,y)))))|^2).$$

This is a self-contained formula for the intensity pattern at the semiconductor wafer.

Note that this is just one embodiment of the forward calculation that can be used within the scope of this invention, chosen by way of example due to its relative simplicity. More sophisticated forward models also fall within the scope of the present invention. Such models may take into account, by way of example but not limitation: various illumination conditions (e.g., off-axis, incoherent), the actual electromagnetics of the light field interacting with the photo-mask, the polarization of the light field, the actual properties of the lens (such as aberrations), and/or the vector nature of the electromagnetic field as it propagates through the optical path in the optical system during the lithographic process.

In some embodiments, during each iteration of the inverse calculation the level-set function corresponding to the mask pattern and/or the write pattern is updated according to $$\Phi_{i+1} = \Phi_i + \Delta\Phi = \Phi_i + \Delta t \cdot \nabla(H),$$

where $\Phi_{i+1}$ is an updated version of the level-set function, $\Phi_i$ is the current version of the level-set function, $\Delta t$ is a step size in the calculation and $\nabla(H)$ is a gradient or a derivative of the error function. Note that $\nabla(H)$ is $$\left. \frac{\delta H}{\delta \phi} \right|_{\phi_i},$$

i.e., it is the Frechet derivative of the cost function H. Furthermore, in some embodiments $\nabla(H)$ is the direction of steepest descent for minimizing or optimizing H by changing $\Phi$. Furthermore, in some embodiments a $1^{st}$ order and/or a $3^{rd}$ order Runge-Kutta method is used when updating $\Phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of the inverse calculation. In particular, the error function H may be allowed to increase during some iterations as the calculation evolves. In this way, the global minimum in the multi-dimensional space may be determined. Note that the size of this multi-dimensional space is proportional to a number of quantization levels to the power of the number of pixels in the mask pattern or the write pattern. In an example embodiment, these patterns or images have at least 1 million pixels (for example, 1024×1024).

In some embodiments, features are added to the mask pattern or the write pattern during the inverse calculation. For example, features associated with sub-resolution assist features (SRAFs) may be added at one or more locations (such as at a maximum and/or a minimum in the gradient of the cost function). These features may help improve the mask pattern or the write pattern and/or may help accelerate convergence of the inverse calculation.

In some embodiments, the inverse calculation is divided into a series of overlapping work units, at least some of which are processed independently and/or concurrently. These work units may be based on features or structures (for example, repetitive structures) in the mask pattern or the write pattern.

In some embodiments, the inverse calculation is run for 100, 1000 or 10,000 iterations at which point the optimal solution has been determined. In other embodiments, the calculation is stopped based on convergence criteria, such as: oscillatory behavior; a relative and/or absolute difference between the target pattern and an estimate of the printed pattern or developed wafer pattern; the latest change to the error function H; and/or the history of changes to the error function H. For example, the relative difference may be less than 1% and/or the absolute difference may be 10 nm for a critical dimension of 100 nm.

Figure 5:
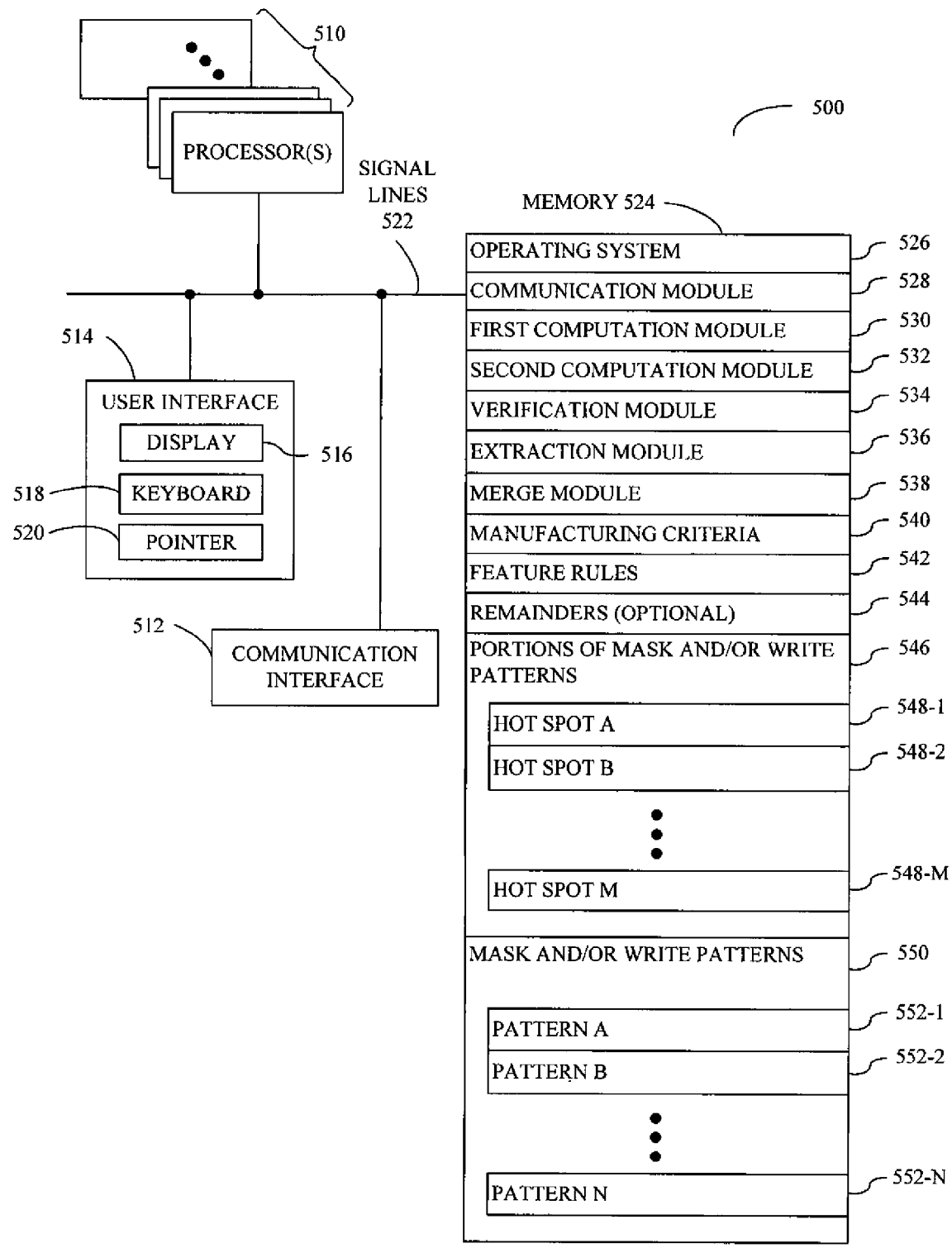
FIG. 5 is a block diagram illustrating a computer system to generate the mask pattern and/or the write pattern in accordance with an embodiment of the present invention.

We now describe embodiments of computer systems that perform the determining or generating of the mask patterns and/or write patterns. FIG. 5 presents a block diagram illustrating an embodiment of a computer system to generate the mask pattern and/or the write pattern. Computer system 500 includes multiple processors 510 or processor cores, a communication interface 512, a user interface 514, and one or more signal lines 522 coupling these components together. Note that the processing units 510 support parallel processing and/or multi-threaded operation, the communication interface 512 may have a persistent communication connection, and the one or more signal lines 522 may constitute a communication bus. Moreover, the user interface 514 may include a display 516, a keyboard 518, and/or a pointer 520, such as a mouse.

Memory 524 in the computer system 500 may include volatile memory and/or non-volatile memory. More specifically, memory 524 may include ROM, RAM, EPROM, EEPROM, FLASH, one or more smart cards, one or more magnetic disc storage devices, and/or one or more optical storage devices. Memory 524 may store an operating system 526 that includes procedures (or a set of instructions) for handling various basic system services for performing hardware dependent tasks. The memory 524 may also store communications procedures (or a set of instructions) in a communication module 528. The communication procedures may be used for communicating with one or more computers, devices and/or servers, including computers, devices and/or servers that are remotely located with respect to the computer system 500.

Memory 524 may also include one or more program modules (or a set of instructions), including: first computation module 530 (or a set of instructions), second computation module 532 (or a set of instructions), verification module 534 (or a set of instructions), extraction module 536 (or a set of instructions), and/or merge module 538 (or a set of instructions). First computation module 530 may determine one or more mask and/or write patterns 550 (such as pattern A 552-1, pattern B 552-2, and/or pattern N 552-N). These patterns may be analyzed using verification module 534 to identify regions that violate pre-determined rules, such as manufacturing criteria 540 and/or feature rules 542.

Next, extraction module 536 may extract at least these regions and generate portions of one or more mask and/or write patterns 546 (such as hotspot A 548-1, hotspot B 548-2, and/or hotspot M 548-M), as well as one or more optional remainders 544 (which include the remainder of the one or more mask or write patterns, i.e., which exclude the regions). Then, second computation module 532 may determine additional regions using these portions. These additional regions, which correspond to the regions, may comply with the pre-determined rules. Alternatively, second computation module 532 may determine additional mask or write patterns (not shown) from a file that includes one or more of the mask or write patterns 550 as well as information associated with the regions.

In some embodiments, verification module 534 is used to confirm that the additional regions and/or the additional mask or write patterns comply with the pre-determined rules. Moreover, in some embodiments merge module 538 combines the additional regions with the optional remainder(s) 544 to generate the additional mask or write patterns (not shown).

Instructions in the various modules in the memory 524 may be implemented in a high-level procedural language, an object-oriented programming language, and/or in an assembly or machine language. The programming language may be compiled or interpreted, i.e., configurable or configured to be executed by the processing units 510.

Although the computer system 500 is illustrated as having a number of discrete components, FIG. 5 is intended to be a functional description of the various features that may be present in the computer system 500 rather than as a structural schematic of the embodiments described herein. In practice, and as recognized by those of ordinary skill in the art, the functions of the computer system 500 may be distributed over a large number of servers or computers, with various groups of the servers or computers performing particular subsets of the functions. In some embodiments, some or all of the functionality of the computer system 500 may be implemented in one or more ASICs and/or one or more digital signal processors DSPs.

Note that computer system 500 may include fewer components or additional components. Moreover, two or more components may be combined into a single component, and/or a position of one or more components may be changed. In some embodiments the functionality of computer system 500 may be implemented more in hardware and less in software, or less in hardware and more in software, as is known in the art.

We now describe embodiments of a data structure that may be used in the computer system 500. FIG. 6 presents a block diagram illustrating an embodiment of a data structure 600. This data structure may include information associated with one or more versions of mask patterns and/or write patterns (such as patterns 610). In particular, a given pattern (such as pattern 610-1) may include pixels 612 and associated values 614.

FIG. 7 presents a block diagram illustrating an embodiment of a data structure 700. This data structure may include information associated with one or more versions of mask patterns and/or write patterns (such as patterns 710). In particular, a given pattern (such as pattern 710-1) may include: pixels 712, associated values 714, and/or additional information 716 associated with regions in the pattern 710-1 that violate pre-determined rules (such as manufacturing criteria 540 and/or feature rules 542 in FIG. 5).

Note that in some embodiments of the data structure 600 (FIG. 6) and/or the data structure 700 there may be fewer or additional components. Moreover, two or more components may be combined into a single component, and/or a position of one or more components may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for determining a mask pattern to be used on a photo-mask in a lithography process, comprising:
   receiving at least a portion of a first mask pattern including first regions that violate pre-determined rules associated with the photo-mask; and
   determining, using the computer, a second mask pattern based on at least the portion of the first mask pattern, wherein the second mask pattern includes second regions that are estimated to comply with the pre-determined rules;
   wherein the second regions correspond to the first regions;
   wherein the second mask pattern is determined using a different technique than that used to determine the first mask pattern;
   wherein at least the portion of the first mask pattern further includes third regions that surround corresponding first regions;
   wherein the third regions are unchanged during the determination of the second mask pattern; and
   wherein a size of the third regions corresponds to an interaction range associated with the lithographic process.

2. The method of claim 1, further comprising:
   analyzing the first mask pattern using the pre-determined rules to identify the first regions; and
   extracting at least the portion of the first mask pattern.

3. The method of claim 2, wherein the analysis of the first mask pattern involves verification.

4. The method of claim 3, wherein the verification is image-based.

5. The method of claim 2, wherein identification of the first regions involves identifying locations associated with violations of the pre-determined rules, and wherein the extraction of at least the portion of the first mask pattern involves calculating the first regions based on one or more geometric relationships for shapes surrounding the locations.

6. The method of claim 5, wherein the one or more geometric relationships include overlapping shapes or adjacent shapes that contact each other along an edge.

7. The method of claim 6, wherein the shapes include polygons.

8. The method of claim 5, wherein the extraction of at least the portion of the first mask pattern involves aggregating the calculated first regions.

9. The method of claim 1, wherein receiving involves accessing at least the portion of the first mask pattern in a computer-readable memory.

10. The method of claim 1, further comprising applying optical proximity correction to at least the portion of the first mask pattern prior to the determination of the second mask pattern.

11. The method of claim 1, further comprising merging the second mask pattern with a remainder of the first mask pattern, wherein the remainder of the first mask pattern excludes the first regions.

12. The method of claim 1, wherein the first regions include hotspots.

13. The method of claim 1, wherein the pre-determined rules include manufacturing rules associated with the photo-mask.

14. The method of claim 1,
wherein a first portion of the third regions are unchanged during the determination of the second mask pattern;
wherein a second portion of the third regions are changed during the determination of the second mask pattern; and
wherein the second portion of the third regions is a transition region between the second regions and the first portion of the second regions.

15. The method of claim 14, wherein an optical characteristic of the second portion of the third regions is approximately unchanged or is improved relative to the optical characteristic of the second portion of the third regions in at least the portion of the first mask pattern.

16. The method of claim 15, wherein the optical characteristic includes intensity, contrast, depth of focus, or a mask error enhancement factor.

17. The method of claim 1, wherein the first mask pattern includes multiple subsets that are to be processed by a group of processors, and wherein the portion of the first mask pattern includes those multiple subsets that are proximate to the first regions.

18. The method of claim 1, further comprising analyzing the second mask pattern using the pre-determined rules to confirm that the second regions comply with the pre-determined rules.

19. The method of claim 18, wherein the analysis of the second mask pattern involves verification.

20. The method of claim 1, wherein in the determination of the second mask pattern involves an inverse lithographic calculation that includes a projection of a target pattern at an image plane in a photolithographic process to an object plane in the photolithographic process.

21. The method of claim 1, wherein the determination of the second mask pattern involves image-based or pixel-based correction.

22. The method of claim 1, wherein at least the portion of the first mask pattern is included in a file that is compatible with a GDSII format.

23. A computer-program product for use in conjunction with a computer system, the computer-program product comprising a non-transitory computer-readable storage medium and a computer-program mechanism embedded therein for determining a mask pattern to be used on a photo-mask in a lithography process, the computer-program mechanism including:
instructions for receiving at least a portion of a first mask pattern including first regions that violate pre-determined rules associated with the photo-mask; and
instructions for determining a second mask pattern based on at least the portion of the first mask pattern, wherein the second mask pattern includes second regions that are estimated to comply with the pre-determined rules;
wherein the second regions correspond to the first regions;
wherein the second mask pattern is determined using a different technique than that used to determine the first mask pattern;
wherein at least the portion of the first mask pattern further includes third regions that surround corresponding first regions;
wherein the third regions are unchanged during the determination of the second mask pattern; and
wherein a size of the third regions corresponds to an interaction range associated with the lithographic process.

24. A computer system to determine a mask pattern to be used on a photo-mask in a lithography process, comprising:
at least one processor;
at least one memory; and
at least one program module, the program module stored in the memory and configured to be executed by the processor, at least the program module including:
instructions for receiving at least a portion of a first mask pattern including first regions that violate pre-determined rules associated with the photo-mask; and
instructions for determining a second mask pattern based on at least the portion of the first mask pattern, wherein the second mask pattern includes second regions that are estimated to comply with the pre-determined rules;
wherein the second regions correspond to the first regions;
wherein the second mask pattern is determined using a different technique than that used to determine the first mask pattern;
wherein at least the portion of the first mask pattern further includes third regions that surround corresponding first regions;
wherein the third regions are unchanged during the determination of the second mask pattern; and
wherein a size of the third regions corresponds to an interaction range associated with the lithographic process.

* * * * *